United States Patent
Lin et al.

(10) Patent No.: US 11,531,433 B2
(45) Date of Patent: Dec. 20, 2022

(54) MANUFACTURING METHOD OF TOUCH DISPLAY DEVICE

(71) Applicant: Unimicron Technology Corp., Taoyuan (TW)

(72) Inventors: Shih-Yao Lin, Hsin-chu County (TW); Ansheng Lee, Hsin-chu County (TW); Ming-Yuan Hsu, Hsin-chu County (TW); Meng-Chia Chan, Hsin-chu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/113,128

(22) Filed: Dec. 7, 2020

(65) Prior Publication Data

US 2022/0129113 A1 Apr. 28, 2022

(30) Foreign Application Priority Data

Oct. 26, 2020 (TW) .................................. 109137074

(51) Int. Cl.
| | | |
|---|---|---|
| *G06F 3/044* | (2006.01) | |
| *H01L 25/04* | (2014.01) | |
| *H01L 25/065* | (2006.01) | |
| *H01L 25/075* | (2006.01) | |

(52) U.S. Cl.
CPC .......... *G06F 3/0443* (2019.05); *H01L 25/048* (2013.01); *H01L 25/0655* (2013.01); *H01L 25/0753* (2013.01); *G06F 2203/04102* (2013.01); *G06F 2203/04103* (2013.01)

(58) Field of Classification Search
CPC ......... G06F 3/0443; G06F 2203/04102; G06F 2203/04103
See application file for complete search history.

(56) References Cited

U.S. PATENT DOCUMENTS

| | | | |
|---|---|---|---|
| 7,098,414 B2 | 8/2006 | Caldwell | |
| 2014/0015772 A1* | 1/2014 | Tung | ........................ G06F 3/041 345/173 |
| 2016/0085269 A1* | 3/2016 | Yeh | ........................ G06F 1/1643 345/173 |
| 2016/0336380 A1* | 11/2016 | Yamazaki | ............... H01L 21/82 |
| 2017/0194383 A1* | 7/2017 | Liu | ...................... H01L 51/5293 |
| 2018/0366661 A1* | 12/2018 | Wang | .................. H01L 51/5246 |
| 2019/0087046 A1* | 3/2019 | Guo | ...................... G06F 3/0445 |
| 2019/0377438 A1* | 12/2019 | Kim | ...................... G06F 3/0443 |

FOREIGN PATENT DOCUMENTS

| | | |
|---|---|---|
| CN | 104853896 | 6/2018 |
| TW | M472252 | 2/2014 |
| TW | 202001527 | 1/2020 |
| TW | I691527 | 4/2020 |

\* cited by examiner

*Primary Examiner* — Md Saiful A Siddiqui
(74) *Attorney, Agent, or Firm* — JCIPRNET

(57) ABSTRACT

A touch display device includes a flexible substrate, a light emitting structure layer, and a flexible touch sensing layer. The flexible substrate has a first surface and a second surface opposite to each other. The light emitting structure layer is disposed on the first surface of the flexible substrate. The flexible touch sensing layer is disposed on the second surface of the flexible substrate.

10 Claims, 3 Drawing Sheets

MANUFACTURING METHOD OF TOUCH DISPLAY DEVICE

CROSS-REFERENCE TO RELATED APPLICATION

This application claims the priority benefit of Taiwan application serial no. 109137074, filed on Oct. 26, 2020. The entirety of the above-mentioned patent application is hereby incorporated by reference herein and made a part of this specification.

BACKGROUND

Technical Field

The disclosure relates to a touch device, and more particularly, to a touch display device.

Description of Related Art

With the rapid development of technology, among manufacturers of home appliances or in-vehicle products, there is a trend of replacing traditional mechanical buttons with capacitive touch interfaces as input interfaces of the new generation. At present, in the design of a touch display device, a touch sensing layer and a light emitting diode are disposed on a same side of a substrate, and the conduction therebetween has to be blocked by an insulating layer. However, when the thickness of the insulating layer is large or the overall thickness is not uniform, the sensed surface capacitive response tends to be weak. At this time, a touch sensing integrated circuit (IC) has to enhance the sensitivity of contact sensing and accelerate the speed of sensing point tracking and positioning. That is, the touch sensing IC is susceptible to interference when analyzing a contact capacitance. Moreover, voltage control has to be precise, or touch detection/positioning would be insensitive. The above all increase difficulties of the design of a touch sensing IC.

SUMMARY

The disclosure provides a touch display device, which may have characteristics of a better touch sensitivity, lightness and thinness, and may reduce production costs.

The disclosure provides a manufacturing method of a touch display device for manufacturing the above touch display device.

The touch display device of the disclosure includes a flexible substrate, a light emitting structure layer, and a flexible touch sensing layer. The flexible substrate has a first surface and a second surface opposite to each other. The light emitting structure layer is disposed on the first surface of the flexible substrate. The flexible touch sensing layer is disposed on the second surface of the flexible substrate.

In an embodiment of the disclosure, the flexible touch sensing layer includes a mesh metal layer or a flexible conductive silver paste layer.

In an embodiment of the disclosure, the light emitting structure layer includes a plurality of nano-level light emitting elements, and each of the nano-level light emitting elements includes a light emitting diode.

In an embodiment of the disclosure, the flexible touch sensing layer includes a plurality of touch sensing portions, and the touch sensing portions are disposed on the flexible substrate separately from one another and expose part of the second surface.

In an embodiment of the disclosure, the light emitting structure layer includes a plurality of light emitting structure portions, and the light emitting structure portions are disposed on the flexible substrate separately from one another and expose part of the first surface.

In an embodiment of the disclosure, the flexible touch sensing layer continuously covers the second surface of the flexible substrate.

In an embodiment of the disclosure, the light emitting structure layer includes a plurality of light emitting structure portions, and the light emitting structure portions are disposed on the flexible substrate separately from one another and expose part of the first surface.

In an embodiment of the disclosure, the light emitting structure layer continuously covers the first surface of the flexible substrate.

In an embodiment of the disclosure, the touch display device further includes a protective layer disposed on the light emitting structure layer. The light emitting structure layer is located between the protective layer and the flexible substrate.

In an embodiment of the disclosure, the touch display device further includes a cover disposed on the flexible touch sensing layer. The flexible touch sensing layer is located between the cover and the flexible substrate.

The manufacturing method of a touch display device of the disclosure includes following steps. A flexible substrate material and a flexible touch sensing material layer disposed on the flexible substrate material are provided. A singulation process is performed on the flexible substrate material and the flexible touch sensing material layer to form a flexible substrate and a flexible touch sensing layer disposed on the flexible substrate. A preheating process is performed on the flexible substrate and the flexible touch sensing layer. A light emitting structure layer, the preheated flexible substrate, and the preheated flexible touch sensing layer are put together into a mold. A bonding process is performed on the light emitting structure layer, the flexible substrate, and the flexible touch sensing layer to form a touch display device. The light emitting structure layer and the flexible touch sensing layer are respectively located on a first surface and a second surface of the flexible substrate.

Based on the above, in the design of the touch display device of the disclosure, the flexible touch sensing layer and the light emitting structure layer are respectively located on two opposite sides of the flexible substrate. Compared with the related art, the disclosure replaces the existing insulating layer with the flexible substrate. In this way, not only are the production costs and the overall thickness of the touch display device reduced, but the flexible touch sensing layer can also control the change in impedance more effectively to improve the touch sensitivity.

In order to make the above features and advantages of the disclosure more comprehensible, embodiments accompanied with drawings are described in detail below.

DETAILED DESCRIPTION OF DISCLOSED EMBODIMENTS

Figure 1A:
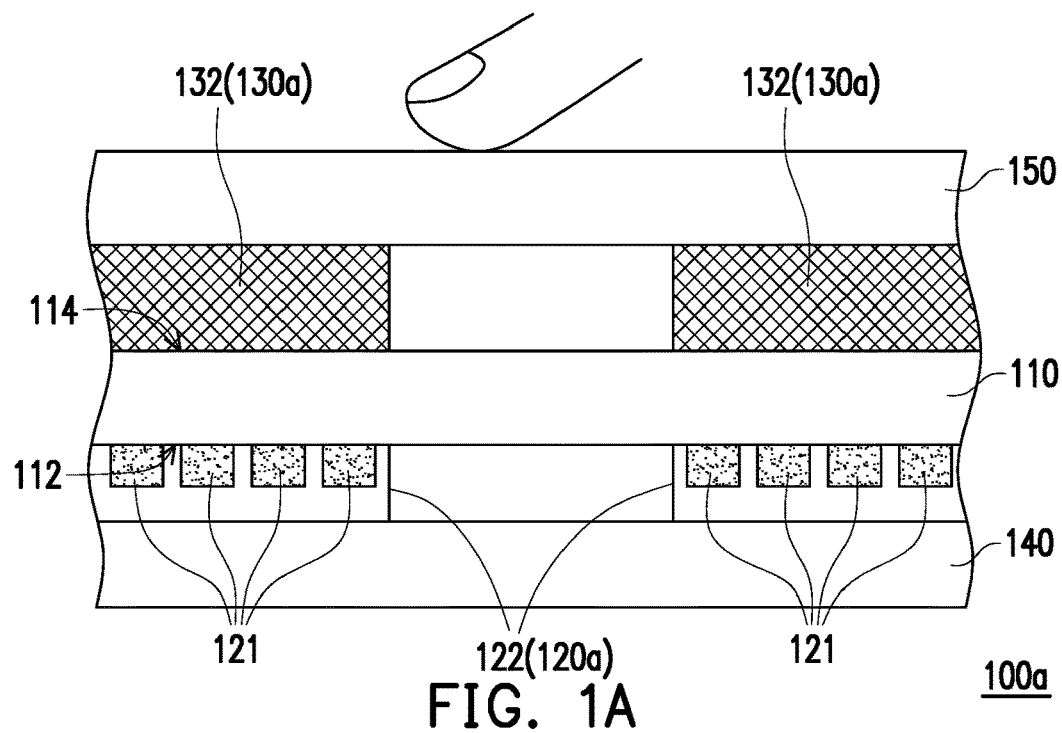
FIG. 1A is a schematic cross-sectional view of a touch display device according to an embodiment of the disclosure.
Figure 1B:
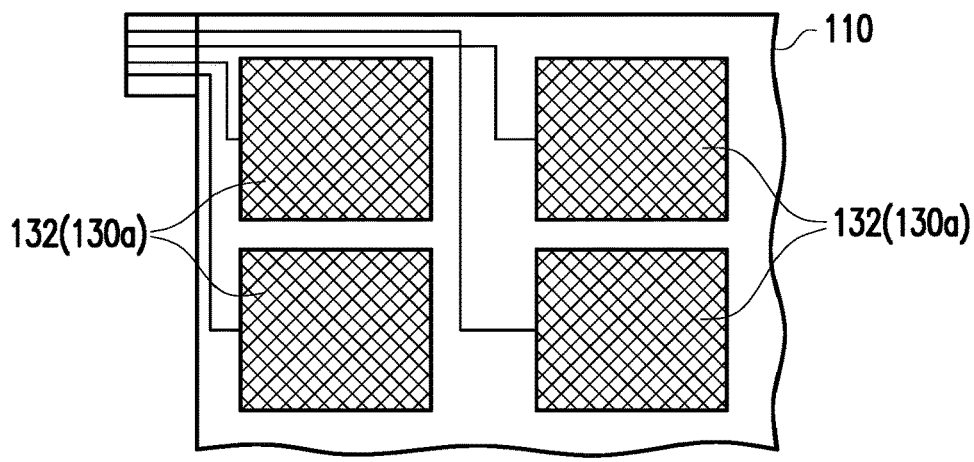
FIG. 1B is a schematic bottom view of the touch display device of FIG. 1A.
Figure 1C:
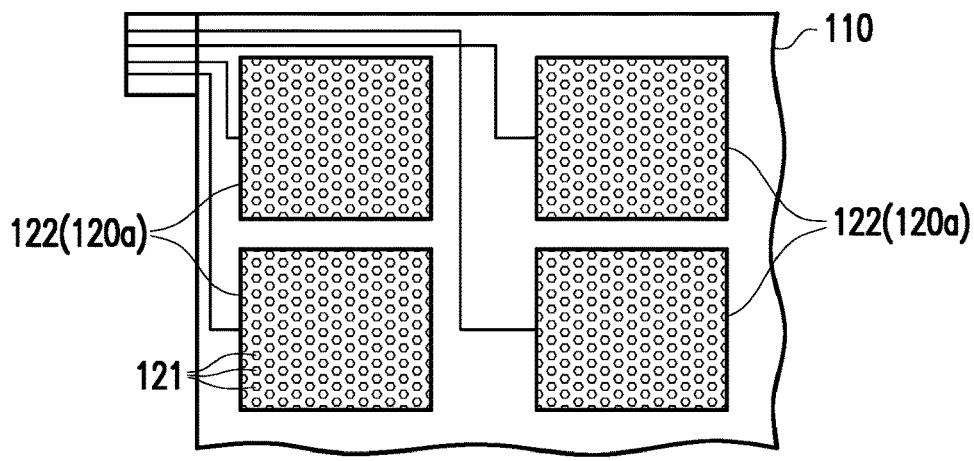
FIG. 1C is a schematic top view of the touch display device of FIG. 1A.

FIG. 1A is a schematic cross-sectional view of a touch display device according to an embodiment of the disclosure. FIG. 1B is a schematic bottom view of the touch display device of FIG. 1A. FIG. 1C is a schematic top view of the touch display device of FIG. 1A.

Referring to FIG. 1A, in the embodiment, a touch display device 100a includes a flexible substrate 110, a light emitting structure layer 120a, and a flexible touch sensing layer 130a. The flexible substrate 110 has a first surface 112 and a second surface 114 opposite to each other. The light emitting structure layer 120a is disposed on the first surface 112 of the flexible substrate 110, and the flexible touch sensing layer 130a is disposed on the second surface 114 of the flexible substrate 110. That is, the light emitting structure layer 120a and the flexible touch sensing layer 130a are disposed on different sides of the flexible substrate 110.

In detail, the flexible substrate 110 of the embodiment includes plastic substrates such as polyethylene terephthalate (PET), polyimide (PI), etc., or optical plastic materials such as cyclo olefin polymer (COP), but the disclosure is not limited thereto. As long as the material is flexible and is an insulating material, it may be used as the flexible substrate 110 of the embodiment.

In particular, referring to FIG. 1B, the flexible touch sensing layer 130a of the embodiment is, for example, a mesh metal layer, but is not limited thereto. In another embodiment, the flexible touch sensing layer 130a may also be, for example, a flexible conductive silver paste layer. Furthermore, referring to FIGS. 1A and 1B at the same time, the flexible touch sensing layer 130a of the embodiment includes a plurality of touch sensing portions 132. The touch sensing portions 132 are disposed on the flexible substrate 110 separately from one another and expose part of the second surface 114. That is, the flexible touch sensing layer 130a does not continuously cover the second surface 114 of the flexible substrate 110. An advantage of the flexible touch sensing layer 130a is that the resistance is lower and the conductive layer is thinner, which enables the touch display device 100a to have a high touch sensitivity and a fast response.

Furthermore, referring to FIGS. 1A and 1C at the same time, the light emitting structure layer 120a of the embodiment includes a plurality of nano-level light emitting elements 121, and each of the nano-level light emitting elements 121 is, for example, a light emitting diode. The light emitting structure layer 120a includes a plurality of light emitting structure portions 122. The light emitting structure portions 122 are disposed on the flexible substrate 110 separately from one another and expose part of the first surface 112. That is, the light emitting structure layer 120a does not continuously cover the first surface 112 of the flexible substrate 110. Herein, the arrangement of the nano-level light emitting elements 121 is not specifically limited but may be a matrix arrangement or an irregular arrangement.

In addition, referring to FIG. 1A again, the touch display device 100a of the embodiment further includes a protective layer 140. The protective layer 140 is disposed on the light emitting structure layer 120a, and the light emitting structure layer 120a is located between the protective layer 140 and the flexible substrate 110. Herein, the protective layer 140 is used to protect the light emitting structure layer 120a, and the material of the protective layer 140 includes, for example, polyethylene terephthalate (PET), polyethylene (PE), polyvinyl chloride (PVC), biaxially oriented polypropylene (OPP), a high light transmission optical film, polymer film materials, plastics, glass, etc., but the disclosure is not limited thereto. In addition, the touch display device 100a of the embodiment further includes a cover 150. The cover 150 is disposed on the flexible touch sensing layer 130a, and the flexible touch sensing layer 130a is located between the cover 150 and the flexible substrate 110. Herein, the cover 150 is used to protect the flexible touch sensing layer 130a, and the material of the cover 150 includes, for example, polymethylmethacrylate (PMMA), a composite material of polymethylmethacrylate (PMMA) and polycarbonate (PC), polycarbonate (PC), glass, plastics, etc., but the disclosure is not limited thereto.

In brief, the flexible touch sensing layer 130a and the light emitting structure layer 120a of the embodiment are respectively located on two opposite sides of the flexible substrate 110, which means that the flexible touch sensing layer 130a and the light emitting structure layer 120a are located on different sides of the flexible substrate 110. Compared with the related art, an existing insulating layer is replaced with the flexible substrate 110 in the embodiment, so there is no need to dispose the insulating layer to block the conduction. In this way, in addition to reducing the production costs and the overall thickness of the touch display device 100a, the flexible touch sensing layer 130a may also control the change in impedance more effectively to improve the touch sensitivity. Furthermore, both the flexible substrate 110 and the flexible touch sensing layer 130a of the embodiment are flexible, which means that they have bendable characteristics. In addition, different driving chips may be used to drive the flexible touch sensing layer 130a and the light emitting structure layer 120a respectively, which may improve the flexibility of using the touch display device 100a.

In applications, the touch display device 100a of the embodiment may be applied to function buttons of household appliances such as power buttons, or function buttons of in-vehicle products such as call answer keys, far and near light indicators, etc. When a finger touches and slides to operate the flexible touch sensing layer 130a of the touch display device 100a, the nano-level light emitting elements 121 of the light emitting structure layer 120a illuminate or light up to display to users.

It is to be noted herein that the following embodiments use the reference numerals and a part of the contents of the above embodiment, and the same reference numerals are used to denote the same or similar elements, and the description of the same technical contents is omitted. For the description of the omitted part, reference may be made to the above embodiment, and details thereof will not be repeatedly described in the following embodiments.

Figure 2:
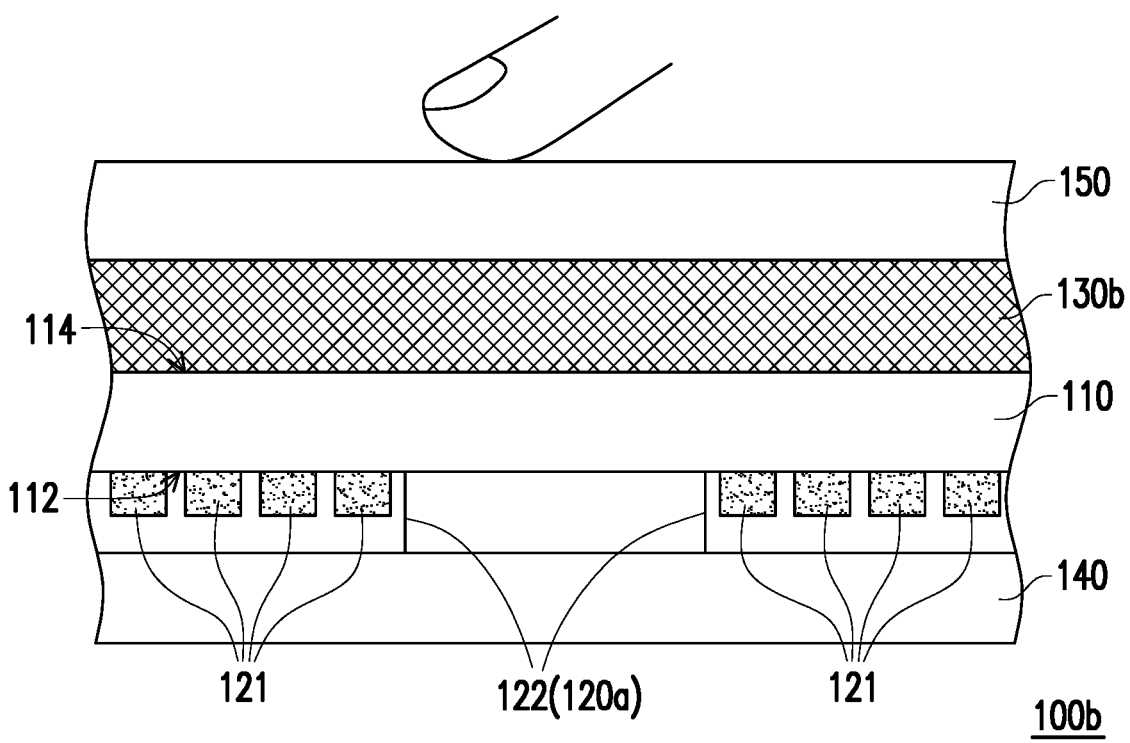
FIG. 2 is a schematic cross-sectional view of a touch display device according to another embodiment of the disclosure.

FIG. 2 is a schematic cross-sectional view of a touch display device according to another embodiment of the disclosure. Referring to FIGS. 1A and 2 at the same time, a touch display device 100b of this embodiment is similar to the touch display device 100a of FIG. 1A, and the difference between the two is that, in this embodiment, a flexible touch sensing layer 130b of the touch display device 100b continuously covers the second surface 114 of the flexible substrate 110. At this time, the light emitting structure portions 122 of the light emitting structure layer 120a are disposed on the flexible substrate 110 separately from one another and expose part of the first surface 112. That is, the light emitting structure layer 120a does not continuously cover the first surface 112 of the flexible substrate 110. The touch display device 100b may be applied to the function buttons of home appliances, or smart touch switches of touch displays related to light/electricity, communication lights, remote controls/keyboards/sound panels, central control systems of hotel rooms, and control panels of medical equipment. When the user touches lightly with a finger, or wakes up the sensing mode with a gesture, switches or signals are activated through a circuit conversion to complete various button lighting which highlights a sense of technology brought by the touch.

Figure 3:
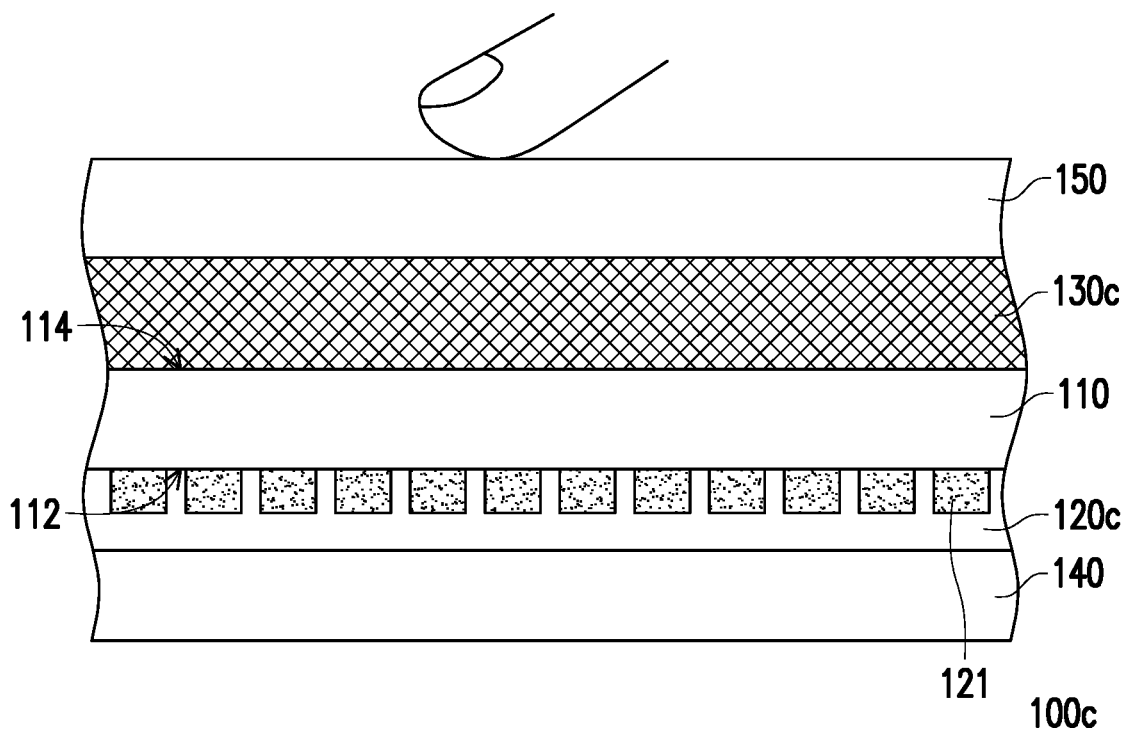
FIG. 3 is a schematic cross-sectional view of a touch display device according to another embodiment of the disclosure.

FIG. 3 is a schematic cross-sectional view of a touch display device according to another embodiment of the disclosure. Referring to FIGS. 1A and 3 at the same time, a touch display device 100c of this embodiment is similar to the touch display device 100a of FIG. 1A, and the difference between the two is that, in this embodiment, a flexible touch sensing layer 130c of the touch display device 100c continuously covers the second surface 114 of the flexible substrate 110. Similarly, a light emitting structure layer 120c continuously covers the first surface 112 of the flexible substrate 110. The touch display device 100c has characteristics of flexibility, a small size, and light weight and may be made into 2D and 3D display devices and switches, and applied to car steering wheels or in-vehicle dashboards, or in-vehicle touch buttons of overhead consoles/environmental consoles/GPS positioning receivers/function buttons of in-vehicle products related to satellite navigation.

Figure 4:
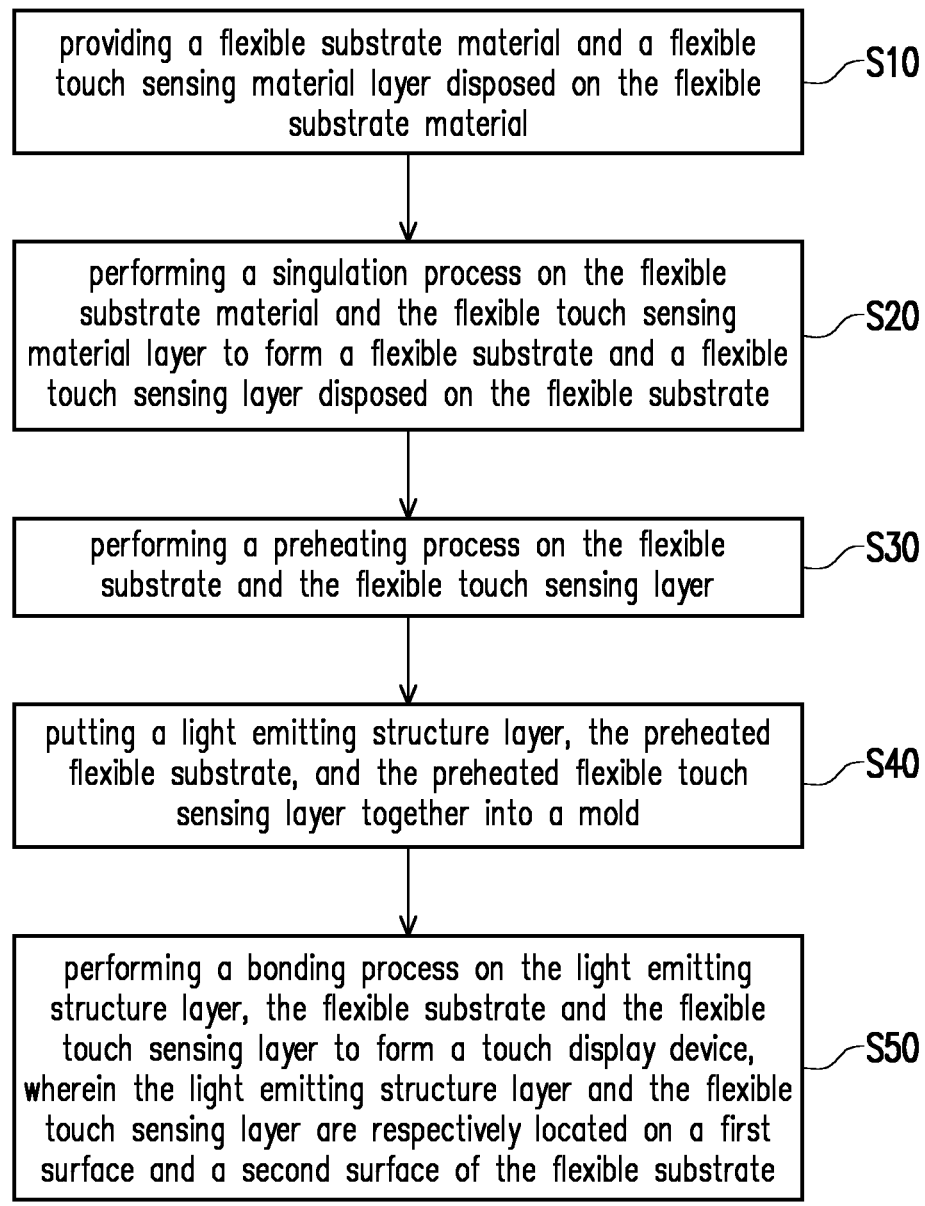
FIG. 4 is a flowchart of a manufacturing method of a touch display device according to an embodiment of the disclosure.

FIG. 4 is a flowchart of a manufacturing method of a touch display device according to an embodiment of the disclosure. Regarding the manufacturing method of the touch display device of the embodiment, referring to FIG. 4 and step S10 first, a flexible substrate material and a flexible touch sensing material layer disposed on the flexible substrate material are provided. Next, in step S20, a singulation process is performed on the flexible substrate material and the flexible touch sensing material layer to form a flexible substrate 110 (please refer to FIG. 1B) and a flexible touch sensing layer 130a (please refer to FIG. 1B) disposed on the flexible substrate 110. That is, the flexible substrate material and the flexible touch sensing material layer disposed on the flexible substrate material are cut to form the flexible substrate 110 and the flexible touch sensing layer 130a thereon in appropriate sizes.

Next, referring to FIG. 4 again, in step S30, a preheating process is performed on the flexible substrate 110 and the flexible touch sensing layer 130a. The above step may not only set the shapes of the flexible substrate 110 and the flexible touch sensing layer 130a thereon, but also facilitate a subsequent bonding process. Next, in step S40, a light emitting structure layer 120a (please refer to FIG. 1C), the preheated flexible substrate 110 (please refer to FIG. 1B), and the preheated flexible touch sensing layer 130a (please refer to FIG. 1B) are put together into a mold. Herein, the light emitting structure layer 120a is, for example, put into the lower mold, and the flexible substrate 110 and the flexible touch sensing layer 130a thereon are, for example, put into the upper mold. Finally, in step S50, a bonding process is performed on the light emitting structure layer 120a, the flexible substrate 110, and the flexible touch sensing layer 130a to form a touch display device 100a (please refer to FIG. 1A), and the light emitting structure layer 120a and the flexible touch sensing layer 130a are respectively located on a first surface 112 and a second surface 114 of the flexible substrate 110. The bonding process herein is, for example, performed based on high-pressure forming. By this time, the manufacturing of the touch display device 100a has been completed.

In brief, in this embodiment, the light emitting structure layer 120a, the flexible substrate 110, and the flexible touch sensing layer 130a are combined together through module packaging with a mold to form an integral structure. In this way, there is no need to use a conventional printed circuit board, so it is possible to effectively reduce the weight of the touch display device 100a and meet the current demands for lightness, thinness, and shortness of electronic products. Furthermore, an integral molding technology uses the more flexible design, which eliminates the dead space left to accommodate wires and connectors. In addition, the above structure is designed to allow higher degree of automation in assembly, and fewer raw materials are required. Also, there is no need to add wires behind a console, which may save at least 30% of the production costs.

In summary of the above, in the design of the touch display device of the disclosure, the flexible touch sensing layer and the light emitting structure layer are respectively located on two opposite sides of the flexible substrate. Compared with the related art, the disclosure replaces the existing insulating layer with the flexible substrate. In this way, not only are the production costs and the overall thickness of the touch display device reduced, but the flexible touch sensing layer can also control the change in impedance more effectively to improve the touch sensitivity.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A manufacturing method of a touch display device, comprising:
   providing a flexible substrate material and a flexible touch sensing material layer disposed on the flexible substrate material;
   performing a singulation process on the flexible substrate material and the flexible touch sensing material layer to cut the flexible substrate material and the flexible touch sensing material layer disposed on the flexible substrate material, so as to form a flexible substrate and a flexible touch sensing layer disposed on the flexible substrate in appropriate sizes;
   performing a preheating process on the flexible substrate and the flexible touch sensing layer;
   putting a light emitting structure layer, the preheated flexible substrate, and the preheated flexible touch sensing layer together into a mold; and
   performing a bonding process on the light emitting structure layer, the flexible substrate, and the flexible touch sensing layer to form a touch display device, wherein the light emitting structure layer and the flexible touch sensing layer are respectively located on a first surface and a second surface of the flexible substrate.

2. The manufacturing method of the touch display device as claimed in claim 1, wherein a protective layer directly disposed on the light emitting structure layer, and the light emitting structure layer is located between the protective layer and the flexible substrate.

3. The manufacturing method of the touch display device as claimed in claim 1, wherein the flexible touch sensing layer comprises a mesh metal layer or a flexible conductive silver paste layer.

4. The manufacturing method of the touch display device as claimed in claim 1, wherein the light emitting structure layer comprises a plurality of nano-level light emitting elements, and each of the nano-level light emitting elements comprises a light emitting diode.

5. The manufacturing method of the touch display device as claimed in claim 1, wherein the flexible touch sensing layer comprises a plurality of touch sensing portions, and the touch sensing portions are disposed on the flexible substrate separately from one another and expose part of the second surface.

6. The manufacturing method of the touch display device as claimed in claim 5, wherein the light emitting structure layer comprises a plurality of light emitting structure portions, and the light emitting structure portions are disposed on the flexible substrate separately from one another and expose part of the first surface.

7. The manufacturing method of the touch display device as claimed in claim 1, wherein the flexible touch sensing layer continuously covers the second surface of the flexible substrate.

8. The manufacturing method of the touch display device as claimed in claim 7, wherein the light emitting structure layer comprises a plurality of light emitting structure portions, and the light emitting structure portions are disposed on the flexible substrate separately from one another and expose part of the first surface.

9. The manufacturing method of the touch display device as claimed in claim 7, wherein the light emitting structure layer continuously covers the first surface of the flexible substrate.

10. The manufacturing method of the touch display device as claimed in claim 1, wherein a cover disposed on the flexible touch sensing layer, and the flexible touch sensing layer is located between the cover and the flexible substrate.

* * * * *